(12) United States Patent
Chen et al.

(10) Patent No.: US 12,369,255 B2
(45) Date of Patent: Jul. 22, 2025

(54) DISPLAY MODULE AND DISPLAY DEVICE

(71) Applicants: Beijing BOE Display Technology Co., Ltd., Beijing (CN); BOE Technology Group Co., Ltd., Beijing (CN)

(72) Inventors: Yuanye Chen, Beijing (CN); Fei Dong, Beijing (CN); Xiang Li, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/030,591

(22) PCT Filed: Mar. 4, 2022

(86) PCT No.: PCT/CN2022/079198
§ 371 (c)(1),
(2) Date: Apr. 6, 2023

(87) PCT Pub. No.: WO2022/267530
PCT Pub. Date: Dec. 29, 2022

(65) Prior Publication Data
US 2023/0371171 A1    Nov. 16, 2023

(30) Foreign Application Priority Data
Jun. 22, 2021   (CN) .......................... 202110692610.2

(51) Int. Cl.
*H05K 1/18*  (2006.01)
*F21V 8/00*  (2006.01)
(Continued)

(52) U.S. Cl.
CPC ........... *H05K 1/189* (2013.01); *G02B 6/0088* (2013.01); *G02F 1/13452* (2013.01);
(Continued)

(58) Field of Classification Search
CPC ...... H05K 1/189; H05K 1/021; H05K 1/0281; H05K 1/147; H05K 2201/10136; H05K 2201/2009; G02B 6/0088; G02F 1/13452
(Continued)

(56) References Cited

U.S. PATENT DOCUMENTS

2005/0259039 A1   11/2005  Kim et al.
2008/0062349 A1 *  3/2008  Komori ............... G02F 1/13452
                                                         349/60
(Continued)

FOREIGN PATENT DOCUMENTS

CN       101852929 A     10/2010
CN       201945768 U      8/2011
(Continued)

OTHER PUBLICATIONS

Office Action dated Aug. 20, 2024, issued in counterpart CN Application No. 202110692610.2, with English translation. (16 pages).
(Continued)

*Primary Examiner* — Binh B Tran
(74) *Attorney, Agent, or Firm* — WHDA, LLP

(57) ABSTRACT

The present application provides a display module and a display device. The display module is applied to a glasses-free 3D display device including a drive circuit board, and the drive circuit board includes at least one first connection buckle; the display module includes a display panel and at least one flexible printed circuit board; the flexible printed circuit board includes a first end and a second end opposite to each other, the first end includes a plurality of bonding parts; the display panel includes a plurality of to-be-bonded parts; each of the bonding parts is bonded to a corresponding to-be-bonded part; the second end includes a second connection buckle; and the second connection buckle is
(Continued)

clamped and electrically connected with the first connection buckle.

19 Claims, 8 Drawing Sheets

(51) Int. Cl.
    *G02F 1/1345*     (2006.01)
    *H05K 1/02*     (2006.01)
    *H05K 1/14*     (2006.01)

(52) U.S. Cl.
    CPC ......... *H05K 1/0216* (2013.01); *H05K 1/0281* (2013.01); *H05K 1/147* (2013.01); *H05K 2201/10136* (2013.01); *H05K 2201/2009* (2013.01)

(58) Field of Classification Search
    USPC .......................................... 361/749
    See application file for complete search history.

(56) References Cited

U.S. PATENT DOCUMENTS

| | | | |
|---|---|---|---|
| 2012/0223659 A1* | 9/2012 | Kang | G02F 1/13452 361/749 |
| 2019/0041681 A1 | 2/2019 | Lai et al. | |
| 2019/0097339 A1* | 3/2019 | Lim | H01R 12/772 |
| 2022/0287183 A1 | 9/2022 | Chen et al. | |

FOREIGN PATENT DOCUMENTS

| | | |
|---|---|---|
| CN | 202041744 U | 11/2011 |
| CN | 102841465 A | 12/2012 |
| CN | 202584693 U | 12/2012 |
| CN | 202837746 U | 3/2013 |
| CN | 203907499 U | 10/2014 |
| CN | 203907500 U | 10/2014 |
| CN | 204178079 U | 2/2015 |
| CN | 204389848 U | 6/2015 |
| CN | 105111951 A | 12/2015 |
| CN | 205194301 U | 4/2016 |
| CN | 206178286 U | 5/2017 |
| CN | 206684439 U | 11/2017 |
| CN | 206848631 U | 1/2018 |
| CN | 208271896 U | 12/2018 |
| CN | 208488631 U | 2/2019 |
| CN | 109705763 A | 5/2019 |
| CN | 208861109 U | 5/2019 |
| CN | 210324971 U | 4/2020 |
| CN | 210381442 U | 4/2020 |
| CN | 111343782 A | 6/2020 |
| CN | 210720926 U | 6/2020 |
| CN | 111474750 A | 7/2020 |
| CN | 111739422 A | 10/2020 |
| CN | 111757592 A | 10/2020 |
| CN | 215730569 U | 2/2022 |
| JP | H03-17627 A | 1/1991 |
| JP | 2001-249352 A | 9/2001 |
| KR | 20050110948 A | 11/2005 |

OTHER PUBLICATIONS

Office Action dated Feb. 28, 2025, issued in counterpart CN Application No. 202110692610.2, with English translation. (21 pages).

* cited by examiner

DISPLAY MODULE AND DISPLAY DEVICE

CROSS-REFERENCE TO RELATED APPLICATION

The present application claims the priority to Chinese patent application No. 202110692610.2, titled "Display Module and Display Device", filed on Jun. 22, 2021 to China National Intellectual Property Administration, the disclosures of which are hereby incorporated by reference.

TECHNICAL FIELD

The present application relates to the field of display technology, in particular to a display module and a display device.

BACKGROUND

With the rapid development of smart handheld devices such as mobile phones and tablet computers and 3D technology, people are not satisfied with watching 3D movies in theaters. It has become a trend for watching 3D movies with tablet computers. As a human-computer interactive medium in the handheld devices, a liquid crystal module is very important. However, the maintenance of glasses-free 3D liquid crystal modules is difficult and high in cost, which is not conducive to product promotion.

SUMMARY

Embodiments of the present application provide a display module and a display device.

In view of the above, the following technical solutions are adopted in the embodiments of the present application.

An aspect provides a display module, applied to a glasses-free 3D display device including a drive circuit board, the drive circuit board including at least one first connection buckle; the display module includes a display panel and at least one flexible printed circuit board; the flexible printed circuit board includes a first end and a second end opposite to each other, the first end includes a plurality of bonding parts, and the display panel includes a plurality of to-be-bonded parts, each of the bonding parts being bonded to a corresponding one of the to-be-bonded parts; the second end includes a second connection buckle, and the second connection buckle is clamped and electrically connected with the first connection buckle.

Optionally, the display module further includes at least one first conductive cloth, the flexible printed circuit board includes a gold finger side and a non-gold finger side opposite to each other; the first conductive cloth is at least partially adhered to a surface of the non-gold finger side of the flexible printed circuit board.

Optionally, a size of the first conductive cloth is less than a size of the flexible printed circuit board.

Optionally, the first conductive cloth includes a black conductive coating, a conductive tensile layer and is conductive adhesive layer that are stacked, and the conductive adhesive layer is adhered to the surface of the non-gold finger side.

Optionally, the first conductive cloth is provided with a plurality of through holes, and positions of the through holes correspond to a bending area of the flexible printed circuit board.

Optionally, the flexible printed circuit board further includes a supporting plate, the supporting plate and the second connection buckle are arranged to be opposite to each other, the supporting plate being arranged at the non-gold finger side, the second connection buckle being arranged at the gold finger side; the first conductive cloth is at least partially adhered to the supporting plate and adhered to all areas on the non-gold finger side except for an area where the supporting plate is located.

Optionally, the flexible printed circuit board further includes an anti-electromagnetic layer arranged all areas on the non-gold finger side except for the area where the supporting plate is located, the first conductive cloth is also adhered to the entire anti-electromagnetic layer.

Optionally the flexible printed circuit board further includes a plurality of copper leakage areas, and the first conductive cloth is grounded through the copper leakage areas.

Optionally, the display module further includes at least one second conductive cloth arranged at an un-bonded side edge of the display panel.

Optionally, the first conductive cloth and any of the second conductive cloth are arranged separately.

Optionally, the first conductive cloth and the second conductive cloth adjacent to each other are overlapped at a junction, and two adjacent second conductive cloths are overlapped at a junction.

Optionally, the display module further includes a middle frame, a backlight module and a back cover, the backlight module is arranged at a backlight side of the display panel; the middle frame is fixed to the back cover and configured to support the display panel; the back cover is configured to support the middle frame and the backlight module; and the backlight module is arranged between the back cover and the display panel.

Optionally, the middle frame includes a plurality of fastening buckles, and the middle frame is clamped with the back cover through the fastening buckles.

Optionally, the back cover includes a base plate and a side plate, and the side plate is arranged around the base plate and connected with the base plate; the side plate is provided with a plurality of openings on a side close to the base plate, and the fastening buckles are embedded in the openings.

Optionally, a material of the back cover includes GM55.

Optionally, a part of the side plate corresponding to an un-bonded side of the display panel includes a double edge folding structure; the double edge folding structure includes a first side edge and a second side edge connected to each other, the second side edge being connected with the base plate, and the openings are arranged on a side of the first side edge close to the base plate.

Optionally, the backlight module includes a reflective fixing tape, a light guide plate and a light bar; the light bar is arranged on a side edge of the light guide plate, and includes a plurality of light emitting diodes; the reflective fixing tape includes a reflective tape and a plurality of fixing parts fixed on the reflective tape, the reflective tape is pasted on the back cover; the fixing parts are arranged between adjacent light emitting diodes; and the plurality of fixing parts are used for fixing the light guide plate to the plurality alight emitting diodes.

Optionally, the display module further includes an adhesive layer arranged between the backlight module and the display panel; the adhesive layer includes a first adhesive part extending along a first direction and a second adhesive part extending along a second direction, the first adhesive part and the second adhesive part are not connected, the first direction intersects with the second direction.

Another aspect provides a display device including the display module described above.

Optionally, the display device further includes a shell and a drive circuit board; the shell is arranged on a backlight side of the display module, and a gap exists between the shell and the display module; the flexible printed circuit board of the display module is bent so that the second end of the flexible printed circuit board is arranged on the backlight side of the display module, the drive circuit board is clamped and electrically connected with the second end, and the drive circuit board is fixed to the shell.

The above description is only a summary of solutions of the present disclosure. In order to learn technical means of the present disclosure more clearly and allow the technical means to be implemented based on the disclosure of the description, and in order to make the above and other objects, features and advantages of the present disclosure more apparent and understandable, specific embodiments of the present disclosure are illustrated below.

BRIEF DESCRIPTION OF THE DRAWINGS

In order to illustrate technical solutions of embodiments of the present disclosure or the related art more clearly, the following will briefly introduce the drawings that need to be used in the description of the embodiments or the related art. Apparently, the drawings in the following description are only some embodiments of the present disclosure. For those skilled in the art, other drawings can be obtained according to these drawings without contributing creative efforts.

DETAILED DESCRIPTION

The technical solutions in the embodiments of the present application will be clearly and thoroughly described below in combination with the drawings in the embodiments of the present application. Apparently, the described embodiments are merely part of the embodiments of the present application, not all of the embodiments. Based on the embodiments in the present application, all other embodiments obtained by those skilled in the art without contributing creative labor will belong to the protection scope of the present application.

In the embodiments of the present application, the words "first", "second", etc. are used to distinguish the same or similar items with basically the same function and role, only for the purpose of clearly describing the technical solution of the embodiments of the present application, and shall not be understood as indicating or implying the relative importance or implicitly indicating the quantity of the indicated technical features.

In the embodiments of the present application, "multiple" means two or more and "at least one" means one or more unless otherwise expressly specified.

In the embodiments of the present application, the terms "up", "down", etc. indicate direction or position relationships shown based on the drawings, and are only intended to facilitate the description of the present application and the simplification of the description rather than to indicate or imply that the indicated device or element must have a specific direction or constructed and operated in a specific direction, and therefore, shall not be understood as a limitation to the present application.

In the related art, the glasses-free 3D liquid crystal module includes an opencell display panel with one end of a chip on film (COF) being bonded to a bare cell and the other end of the COF being bonded to a printed circuit board (PCB). Due to the large amount of computation of the glasses-free 3D technology, the PCB used is a field programmable gate array (FPGA) circuit board. The overall weight of the board is large and the heat generated in the board is extremely high.

In order to achieve glasses-free 3D display, a layer of grating is required to be bonded to the surface of the opencell display panel. However, at present, the yields of both of the grating and the FPGA board are low. If the conventional bonding design is still adopted, once being defective, the grating or FPGA board can only be repaired after being un-bonded, thereby greatly increasing the difficulty and cost of maintenance.

Figure 1:
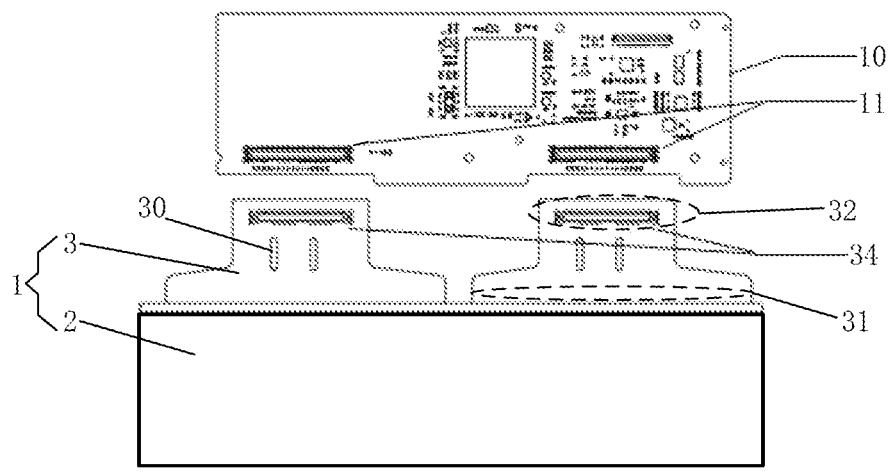
FIG. 1 is a structural schematic diagram of a display panel, 4 flexible printed circuit board and a drive circuit board provided by an embodiment of the present application.

Based on the above, embodiments of the present application provide a display module applied to a glasses-free 3D display device. As shown in FIG. 1, the glasses-free 3D display device includes a drive circuit board 10, and the drive circuit board 10 includes at least one first connection buckle 11.

The type of the display module is not limited. For example, the display module can be a liquid crystal display module or an organic light emitting diode (OLED) display module. The size of the display module is not limited. For example, if the display module is applied to a glasses-free 3D tablet device, the size of the display module can be 10.1 inches, 10.87 inches, or 10.9 inches, or other sizes. The display module can be used in glasses-free 3D display products such as glasses-free 3D tablet, glasses-free 3D mobile phone, glasses-free 3D computer, virtual reality (VR) device or augmented reality (AR) device.

The drive circuit board can include an FPGA circuit board or ARM (Advanced RISC Machines) circuit board, etc, which is not limited here. Since the glasses-free 3D technology has large amount of computations, in order to improve the response speed, the FPGA circuit board is generally used as the drive circuit board in the glasses-free 3D display device.

Figure 2:
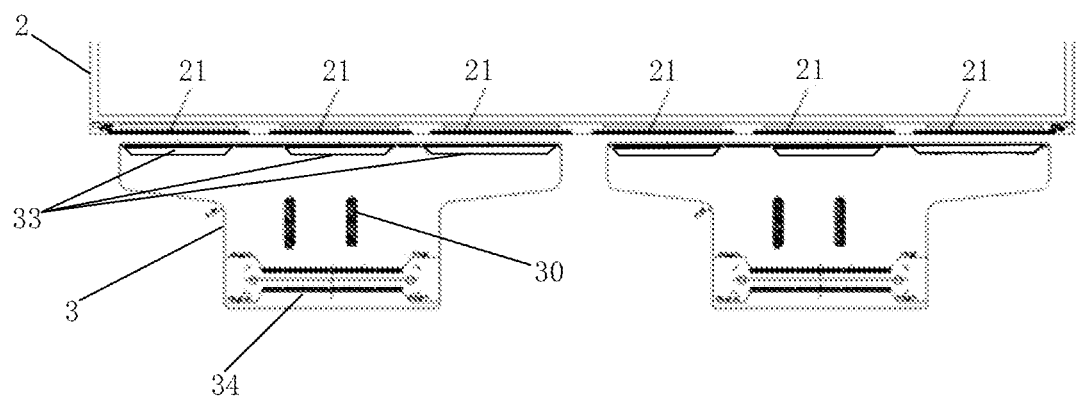
FIG. 2 is a structural schematic diagram of a display panel and a flexible printed circuit board provided by an embodiment of the present application.

In combination with FIG. 1 and FIG. 2, the display module 1 includes a display panel 2 and at least one flexible printed circuit board 3. The flexible printed circuit board 3 includes a first end 31 and a second end 32 opposite to each other. The first end includes a plurality of bonding parts 33, and the display panel 2 includes a plurality of to-be-bonded parts 21. Each of the bonding parts is bonded to a corresponding to-be-bonded part. The second end 32 includes a second connection buckle 34, and the second connection buckle 34 is clamped and electrically connected to the first connection buckle 11. FIG. 1 is drawn with the display module including two flexible printed circuit boards as an example; FIG. 2 is drawn with the first end including three bonding parts and the display panel including three to-be-bonded parts 21 as an example; and FIG. 2 only schematically illustrates the partial structure of the display panel 2.

The structures of the first connection buckle and the second connection buckle are not limited, as long as the clamping electrical connection can be realized. The number of the flexible printed circuit boards is not limited, and needs to be selected according to the size of the display panel and other parameters.

For realizing glasses-free 3D display, the display module can further include a grating attached to the light-exiting surface of the display panel. Of course, the display module can further include a middle frame, a backplane, and other structures, which will be described in details later, and is not described here.

The flexible printed circuit board (FPC) may include a COF unit and a hollowed-out area 30 as shown in FIG. 1 and FIG. 2. The flexible printed circuit board is flexible and bendable. To achieve a narrow bezel, the flexible printed circuit board can be bent so that the second end of the flexible printed circuit board is arranged on the backlight side of the display panel. The display panel includes a display side and a backlight side. The display side is used to display pictures, and the backlight side is arranged opposite to the display side.

Figure 3:
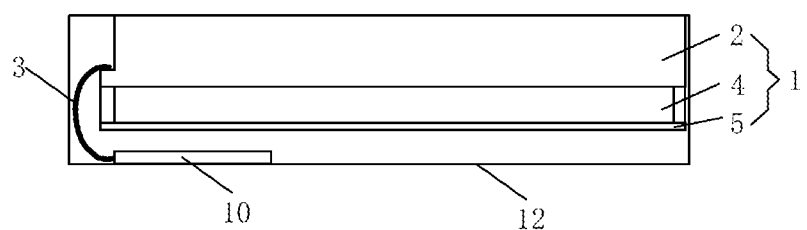
FIG. 3 is a structural schematic diagram of a display device provided by an embodiment of the present application.

It should be noted that the above drive circuit board can be fixed on the backlight side of the display module. However, the heat generated by the drive circuit board is extremely high. The heat transferred to the display module cannot be effectively transmitted out, resulting in wrinkle defects of film materials in the display module. In order to enhance heat dissipation, as shown in FIG. 3, the drive circuit board 10 can be fixed on a shell 12 of the glasses-free 3D display device. There is a gap between the shell 12 and the display module 1, so that the heat dissipation space is increased and the heat dissipation efficiency is improved.

In the present application, the second end of the flexible printed circuit board includes the second connection buckle, and the second connection buckle is clamped and electrically connected with the first connection buckle, i.e., the flexible printed circuit board and the drive circuit board are clamped with each other through the buckles. Then, when the drive circuit board or the grating of the display module is defective and needs to be repaired, maintenance can be made only by unlocking the first connection buckle and the second connection buckle, thereby avoiding the operation of unbinding, and greatly reducing the difficulty and cost of maintenance.

In addition, the flexible printed circuit board belongs to a special-shaped flexible printed circuit board; the first end of the flexible printed circuit board includes a plurality of bonding parts; and each bonding part corresponds to one to-be-bonded part of the display panel respectively. Such flexible printed circuit board can be bonded to a plurality of to-be-bonded parts of the display panel. Compared with the situation that one flexible printed circuit board can only be bonded to one to-be-bonded part of the display panel, the display module provided in the present application can significantly reduce the number of flexible printed circuit boards, thereby reducing the number of assembling the buckles and reducing the difficulty of assembly alignment.

For example, a 10.87-inch glasses-free 3D tablet is taken as an example. The display panel includes six to-be-bonded parts. If a conventional flexible printed circuit board is used, six boards need to be used and buckles need to be assembled for six times, which is very difficult to assemble. On the contrary, if the flexible printed circuit board provided in the present application is used, considering the maximum number of pins supported by the buckles and the operability, the flexible printed circuit board can include 3 bonding parts, only 2 boards and twice assembly of the buckles are needed to complete the clamping electrical connection between the flexible printed circuit board and the drive circuit board. By comparison, the present application can reduce 4 boards and reduce 4 times of assembly of the buckles, thereby greatly reducing the difficulty of assembly and optimizing the mass production. Meanwhile, the 2 boards can adopt the same structure, thereby further simplifying the material supply.

Figure 4:
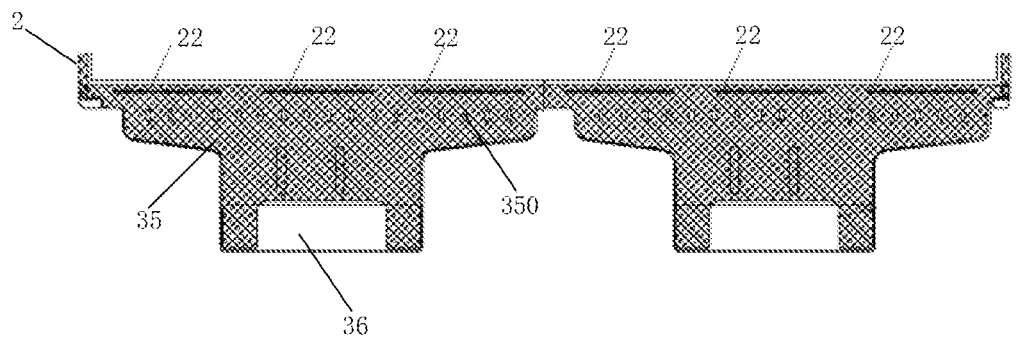
FIG. 4 is a structural schematic diagram of a flexible printed circuit board provided with a first conductive cloth provided by an embodiment of the present application.

In order to reduce electromagnetic interference and improve the display effect, optionally, as shown in FIG. 4, the display module further includes at least one first conductive cloth 35. The flexible printed circuit board includes a gold finger side and a non-gold finger side opposite to the gold finger side. The first conductive cloth is at least partially adhered to the surface of the flexible printed circuit board on the non-gold finger side.

The size, shape and material of the first conductive cloth are not limited. For example, the material of the first conductive cloth may be aluminum foil composite material, or black conductive material. The number of the first conductive cloths is the same as that of the flexible printed circuit boards. For example, if the display module includes two flexible printed circuit boards as shown in FIG. 2, then the number of the first conductive cloths is also two. In addition, the two first conductive cloths 35 may be connected as shown in FIG. 4, or may not be connected, which is not limited here. In FIG. 4, an area where the display panel and the flexible printed circuit board are bonded to each other is labeled as 22. In FIG. 4, one flexible printed circuit board has three bonding areas for the display panel.

In the above flexible printed circuit board, the gold finger side refers to a side at which a gold finger is arranged, and a side opposite to the gold finger side is the non-gold finger side. The gold finger includes a plurality of golden conductive contact pieces, and is named because the surface of the gold finger is plated with gold and the conductive contact pieces are arranged like fingers. Signals generated by the flexible printed circuit board can be transmitted by the gold fingers to other structures (e.g., the drive circuit board).

The first conductive cloth may be partially or fully adhered to the surface of the flexible printed circuit board on the non-gold finger side, which is not limited here. Of course, the larger the adhered area between the first conductive cloth and the surface of the flexible printed circuit board on the non-gold finger side, the stronger the anti-electromagnetic interference ability of the display module.

The first conductive cloth may be used to prevent electromagnetic interference, isolate the user from the Lazard of the electromagnetic wave, avoid the influence of unwanted voltage or current on the flexible circuit board.

Further, optionally, the size of the first conductive cloth is smaller than the size of the flexible printed circuit board, so that the boundary of the first conductive cloth may not exceed the boundary of the flexible printed circuit board. Therefore, dust is avoided to be fallen on the first conductive cloth, and the performance of the first conductive cloth is ensured.

The size and shape of the first conductive cloth can be selected according to the size and shape of the flexible printed circuit board. Therefore, meanwhile, the boundary of the first conductive cloth is shrunk by a preset distance relative to the boundary of the flexible printed circuit board. The preset distance may be in a range of 0.2-1 mm. For example, the preset distance may be 0.5 mm. The flexible printed circuit board shown in FIG. 4 is a special-shaped flexible printed circuit board, and the first conductive cloth pasted thereon is also a special-shaped conductive cloth.

Figure 5:
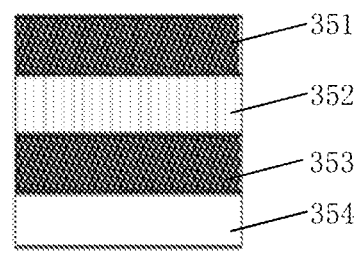
FIG. 5 is a structural schematic diagram of a first conductive cloth provided by an embodiment of the present application.

Optionally, in order to achieve strong light shielding and light absorption to protect the flexible printed circuit board, as shown in FIG. 5, the first conductive cloth includes a black conductive coating 351, a conductive tensile layer 352 and a conductive adhesive layer 353 stacked, and the conductive adhesive layer 353 is adhered to the surface of the non-gold finger side. The black conductive coating has the function of light shielding and light absorption, the conductive tensile layer has stretchability, and the conductive adhesive layer has adhesive property. In order to ensure the viscosity of the first conductive cloth, before the first conductive cloth is used, a side of the conductive adhesive layer away from the conductive tensile layer in the first conductive cloth is further provided with a release layer 354 as shown in FIG. 5. When the first conductive cloth is used, the release layer is torn off and the side of the conductive adhesive layer is adhered to the surface of the non-gold finger side.

When the display module is applied to a narrow bezel glasses-free 3D display device, to achieve a narrow bezel effect, the flexible printed circuit board needs to be bent, so that the second end of the flexible printed circuit board is arranged on the backlight side of the display panel. At this time, the first conductive cloth adhered to the flexible printed circuit board bends along with the flexible printed circuit board. In order to reduce the stress generated by bending and prevent defects, optionally, as shown in FIG. 4, the first conductive cloth 35 is provided with a plurality of through holes 350, and the positions of the through holes correspond to the bending area of the flexible printed circuit board.

Figure 6:
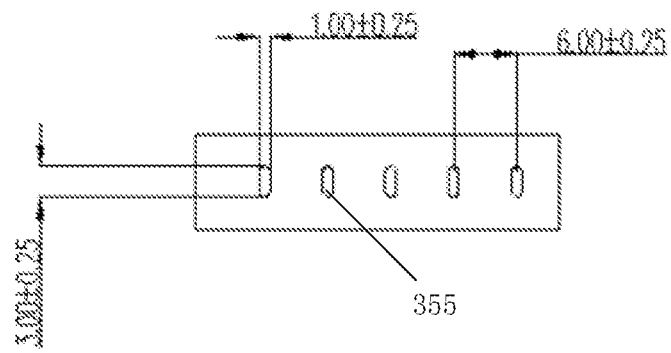
FIG. 6 is a structural schematic diagram of a racetrack-shaped hole provided by an embodiment of the present application.

The through holes can be round holes, racetrack-shaped holes (also referred to as ovaloid holes), or through holes of other shapes. In order to improve the fault tolerance rate, the racetrack-shaped holes can be selected. There it no limit on the specific size of the racetrack-shaped holes here. For example, as shown in FIG. 6, racetrack-shaped holes 355 of 3 mm*1 mm can be used, and the spacing between two adjacent racetrack-shaped holes 355 is 6 mm.

In order to provide strong support to the second connection buckle, and provide adequate press support during the ping in and plug off of the first connection buckle and the second connection buckle, optionally, as shown in FIG. 4, the flexible printed circuit board further includes a supporting plate 36. The supporting plate and the second connection buckle are arranged opposite to each other. The supporting plate is arranged on the non-gold finger side, and the second connection buckle is arranged on the gold finger side.

As shown in FIG. 4, the first conductive cloth 35 is at least partially adhered to the supporting plate 36, and adhered to all areas on the non-gold finger side except for the area where the supporting plate is located.

The supporting plate can be made of a reinforced steel plate or a reinforced iron plate, and of course can also be made of other materials, which is not limited here.

The first conductive cloth can be partially or fully adhered to the supporting plate, which is not limited here. FIG. 4 shows an example where the first conductive cloth 35 is adhered to both ends of the supporting plate 36.

A gate driver on array (GOA) circuit is arranged on the flexible printed circuit board. However, a Gate IC of the GOA circuit generates a lot of radiation during operation, which is difficult to meet the requirements of reducing electromagnetic interference of the whole machine. The first conductive cloth is at least partially adhered to the supporting plate, so that the radiation can be effectively transferred to the outside, thereby greatly reducing electromagnetic interference.

Figure 7:
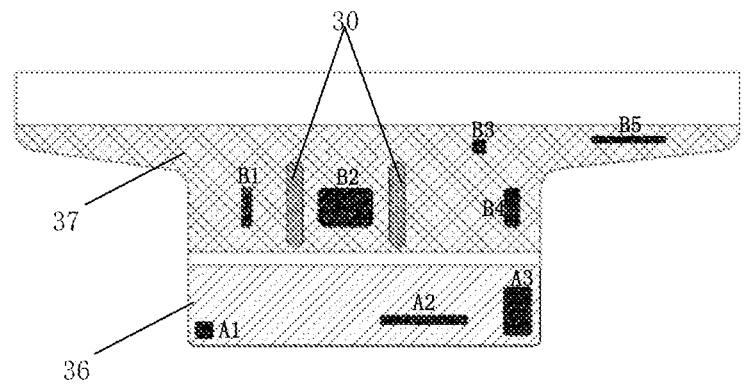
FIG. 7 is a structural schematic diagram of a flexible printed circuit board provided with an anti-electromagnetic layer and a supporting plate provided by an embodiment of the present application.

Further, optionally, in order to further improve the anti-electromagnetism property, as shown in FIG. 7, the flexible printed circuit board further includes an anti-electromagnetic layer 37. The anti-electromagnetic layer 37 is arranged in all areas on the non-gold finger side except for the area where the supporting plate 36 is located; and the first conductive cloth is also adhered to the entire anti-electromagnetic layer.

Because the supporting plate generally adopts the reinforced steel plate, and the anti-electromagnetic layer is difficult to coat the reinforced steel plate, no anti-electromagnetic layer is arranged on the supporting plate. Of course, if the supporting plate adopts other materials, the anti-electromagnetic layer can also be arranged on the supporting plate.

Further, optionally, in order to more efficiently transfer the radiation out to further reduce electromagnetic interference, the flexible printed circuit board further includes a plurality of copper leakage areas, and the first conductive cloth is grounded through the copper leakage areas.

The specific position and size of the copper leakage areas are not limited here. The copper leakage areas can be arranged in areas of the flexible printed circuit board where no circuit is located. For example, as shown in FIG. 7, the copper leakage area can be arranged in area A1, area A2 and area A3 of the supporting plate 36. Of course, if the flexible printed circuit board includes an anti-electromagnetic layer, the copper leakage areas can also be arranged in area B1, area B2, area B3, area B4 and area B5 of the anti-electromagnetic layer 37.

Figure 8:
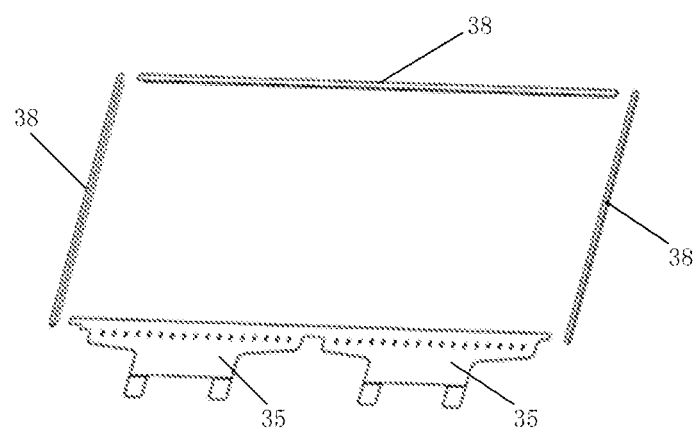
FIG. 8 is a structural schematic diagram of a first conductive cloth and a second conductive cloth provided by an embodiment of the present application.

In one or more embodiments, in order to avoid light leakage on the side of the display module and improve the shielding effect, as shown in FIG. 8, the display module further includes at least one second conductive cloth 38; and the second conductive cloth is arranged on a side edge of the display panel that is not bonded.

The shape of the display module is not limited, and rectangle is illustrated in FIG. 8 as an example. The display module includes three second conductive cloths 38 and two first conductive cloths 35, and the three second conductive cloths form a U shape.

It should be noted that a side edge of the display panel bonded to the flexible printed circuit board is called as a bonded side edge (also referred to as DP side), and the rest side edges are called as un-bonded side edges.

If the display module includes a plurality of second conductive cloths, two adjacent second conductive cloths can be connected, or not connected, which is not limited here. Adjacent second conductive cloth and first conductive cloth can be connected, or not connected, which is not limited here.

Further, optionally, in order to reduce the design cost, as shown in FIG. 8, the first conductive cloths 35 and all the second conductive cloths 38 are arranged separately. That is, the first conductive cloth and all the second conductive cloths are arranged individually. As shown in FIG. 8, the display module includes four segments of split conductive cloths. The second conductive cloths on the left and right sides can be of the same structure, thereby reducing the design cost.

Figure 9:
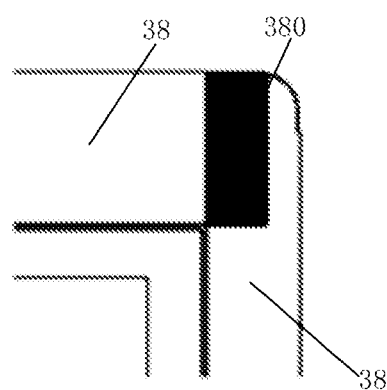
FIG. 9 is a schematic diagram illustrating a structure where two adjacent second conductive cloths overlap with each other provided by an embodiment of the present application.

Further, optionally, in order to improve the conductivity and further enhance the anti-electromagnetism, the first conductive cloth and the second conductive cloth adjacent to each other are overlapped at a junction. As shown in FIG. 9, two adjacent second conductive cloths 38 are overlapped at a junction 380, so that the first conductive cloth and the second conductive cloths are all connected together, which can quickly and effectively transfer radiation out.

Figure 10:
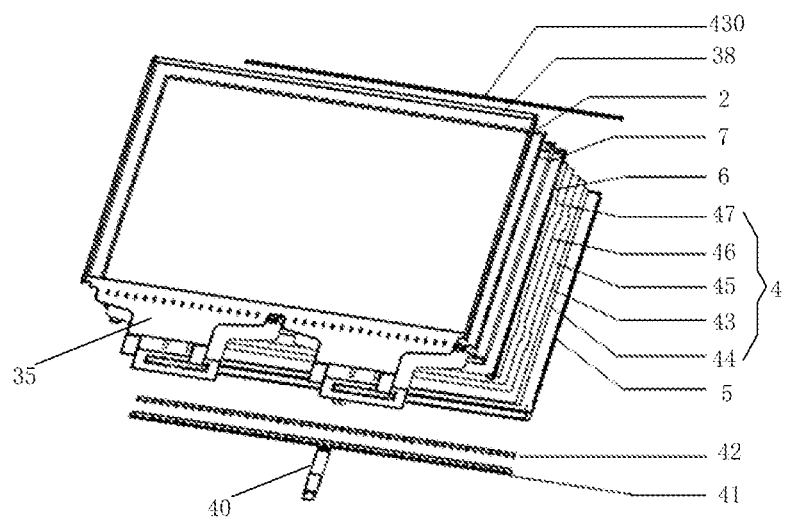
FIG. 10 is an exploded structural schematic diagram of a display module provided by an embodiment of the present application.

In one or more embodiments, in order to provide better support to the display panel for the subsequent assembly of the whole machine, as shown in FIG. 10, the display module further includes a middle frame 6, a backlight module 4 and a back cover 5. The backlight module is arranged on the backlight side of the display panel; the middle frame is fixed to the back cover and configured to support the display panel; the back cover is configured to support the middle frame and the backlight module; and the backlight module is arranged between the back cover and the display panel. FIG. 10 is the exploded diagram of the display module, where a reflective fixing tape 42, a light bar 41 and an LED drive board 40 also belong to the backlight module 4.

The display panel can be a liquid crystal display panel. In this case, the display module can be a liquid crystal display module. The backlight module is configured to provide backlight for the liquid crystal display panel. The specific structures of the liquid crystal display panel and the backlight module are not limited here, which can be obtained according to the relevant technology and will not be described here.

Figure 11:
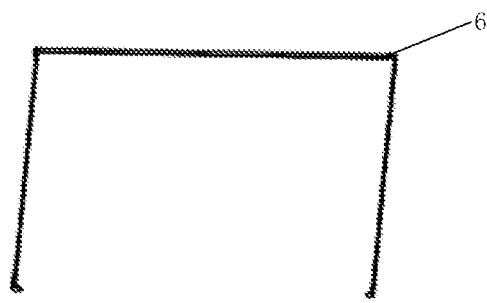
FIG. 11 is a structural schematic diagram of a middle frame provided by an embodiment of the present application.

In the embodiments of the present application, the fixing mode of the middle frame and the back cover is not limited, and can be determined according to actual requirements. The material of the back cover can be 304 stainless steel, 430 stainless steel or GM55 or other materials, which is not limited here. The material of the middle frame can be PC (polycarbonate), or other polymer materials. If PC is used to make the middle frame, the color of the middle frame is white. If the display module is applied in a large-size glasses-free 3D display device such as TV and display, the middle frame can adopt a hollow square frame structure. If the display module is applied in a small-size glasses-free 3D display device such as the tablet and mobile phone, in order to save space, the middle flame can be a U-shaped frame as shown in FIG. 11. Specifically, in the middle frame, the U-shaped frame is arranged in a position corresponding to the un-bonded side edges of the display panel, and no frame is arranged in a position corresponding to the bonded side edge of the display panel. The bonded side edge of the display panel can be supported by folding the back cover closer to the display panel. The figures in the embodiment of the preset application are shown with the U-shaped middle frame as an example.

It should be noted that in order to achieve a narrow bezel, the flexible printed circuit board of the above display module can be bent so that the second end of the flexible printed circuit board is arranged on the backlight side of the display panel. Specifically, the flexible printed circuit board can be bent so that the second end thereof is arranged at a side of the back cover away from the display panel.

Figure 12:
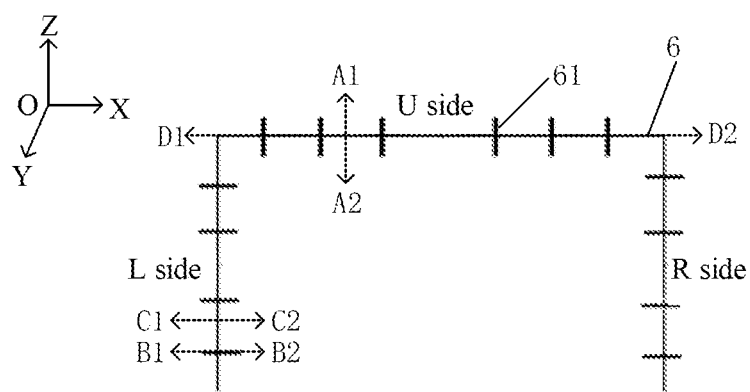
FIG. 12 is a structural schematic diagram of another middle flame provided by an embodiment of the present application.

Further, optionally, as shown in FIG. 12, the middle frame 6 includes a plurality of fastening buckles 61, and the middle frame is clamped with the back cover through the fastening buckles.

The specific structures and positions of the above fastening buckles are not limited and can be determined according to actual requirements. In addition, the specific number of the fastening buckles is not limited. FIG. 12 is shown with the U-shaped middle frame as an example. For convenience of illustration, an upper border of the middle frame shown in FIG. 12 is marked as a U-side middle frame, a left border is marked as an L-side middle frame, and a right border is marked as a R-side middle frame, and the U-side middle frame the L-side middle frame, and the R-side middle frame correspond to different side edges of the un-bonded side of the display panel. FIG. 12 shows an example where the U-side middle frame includes 6 fastening buckles, the L-side middle frame and the R-side middle frame each includes 4 fastening buckles.

Figure 13:
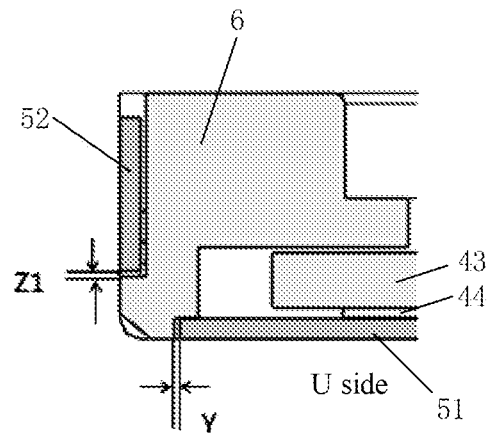
FIG. 13 is a cross sectional view of a display module A1A2 direction shown in FIG. 12.
Figure 14:
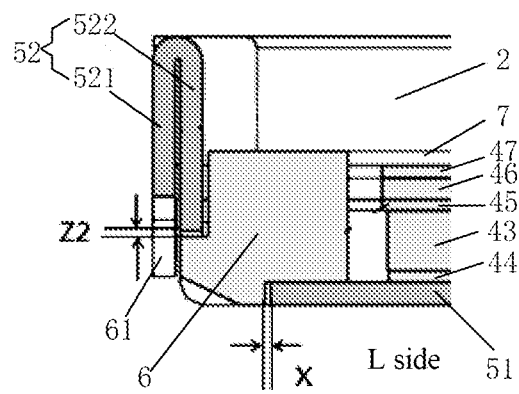
FIG. 14 is a cross sectional view of a display module along B1B2 direction shown in FIG. 12.
Figure 15:
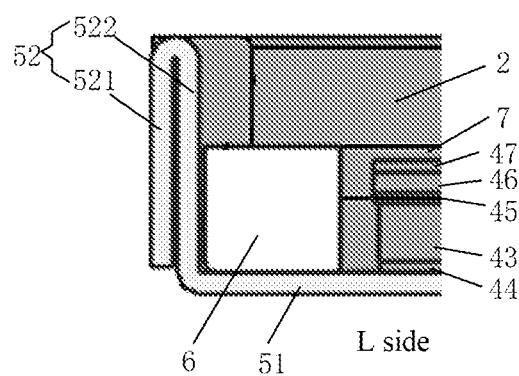
FIG. 15 is a cross sectional view of a display module along C1C2 direction shown in FIG. 12.
Figure 16:
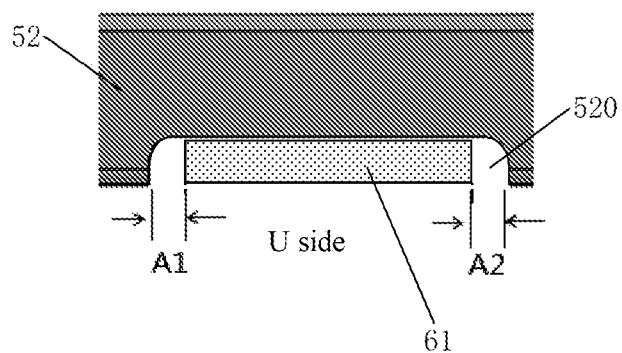
FIG. 16 is a cross sectional view of a display module along D1D2 direction shown in FIG. 12.

Optionally, to further save space and improve the positioning accuracy of the fastening buckles, as shown in FIGS. 13-15, the back cover includes a base plate 51 and a side plate 52. The side plate 52 is arranged around the base plate 51 and connected with the base plate 51. As shown in FIG. 16, a plurality of openings 520 are arranged at a side of the side plate 52 near the base plate, and the fastening buckles 61 are embedded in the opening 520.

The fastening buckles can be called as embedding buckles. The fastening buckles can simultaneously locate x, y and z axes through coarse positioning and fine positioning. Description is made by taking the U side of the U-shaped middle frame as an example, and the L side and R side are similar. FIG. 16 is a cross sectional view of the display module along the D1D2 direction shown in FIG. 12. As shown in FIG. 16, the fastening buckle 61 is embedded in the opening 520 of the side plate 52 in the back cover for conducting coarse positioning first, i.e., determining the distances between the fastening buckle 61 and the side plate 52 on the left and right sides (marked as A1 and A2, respectively). For example, A1=A2=0.5 mm. Of course, other values can be selected for A1 and A2, depending on the sizes of the fastening buckle and the opening of the side plate. Then, fine positioning is conducted. For the U side of the U-shaped idle frame, FIG. 13 is a cross sectional view of the display module along the A1A2 direction as shown in FIG. 12. As shown in FIG. 13, it is necessary to determine a distance Z1 between the middle frame 6 and the side plate 52 along a direction perpendicular to the base plate, and a distance Y between the middle frame 6 and the base plate 51 along a direction parallel to the base plate. For example, Y=0.05 mm and Z1=0.05 mm, that is, the fastening buckle on the U side can control the orientation the Z direction and the orientation in the Y direction. For the L side and R side of the U-shaped middle frame, description is made by taking the L side as an example, and the R side is similar. FIG. 14 is a cross sectional view of the display module along the B1B2 direction shown in FIG. 12. As shown in FIG. 14, it is necessary to determine a distance Z2 between the middle frame 6 and the second side edge 522 of the side plate 52 along the direction perpendicular to the base plate, and a distance X between the middle frame 6 and the base plate 51 along the direction parallel to the base plate. For example, X=0.05 mm and Z2=0.05 mm, that is, the fastening buckle on the L side can control the orientation on the Z direction and the orientation on the X direction. It should be noted that the side plate corresponding to the U side in FIG. 1 is a single side edge structure, and the side plate corresponding to the L side in FIG. 14 is a double edge folding structure.

Further, optionally, to greatly improve the heat dissipation effect, the material of the back cover includes GM55. The specific model and thickness of GM55 are not limited here. GM55 has high strength, excellent compressive strength, excellent heat dissipation function, complete non-magnetism no effect on the global positioning system (GPS) function, and certain anti-corrosion. Four materials of GM55-H28, SUS304-1/2H, SUS304-3/4H and SUS430.1D with thickness of 0.2 t are compared. As shown in Table 1, compared with the traditional stainless steel, GM55 has thermal conductivity of about 9 times of the stainless steel, and has obvious superiority on the heat dissipation effect. However, the hardness of GM55 is worse than the traditional stainless steel.

TABLE 1

| Material of the back cover | Tensile Strength (MPa) | Shear Strength (MPa) | Thermal conductivity (W/(m · K)) | Hardness (Hv) |
| --- | --- | --- | --- | --- |
| SUS304-1/2H (0.2t) | 865 | 606 | 13.86 | 250~310 HV |
| SUS304-3/4H (0.2t) | 1050 | 650 | 13.86 | 310~370 HV |
| SUS430.1D (0.2t) | 485 | 340 | 16.3 | 160 HV |
| GM55-H28 (0.2t) | 380 | 310 | 117 | 73 HV |

In order to improve the supporting performance of the back cover formed by GM55, a part of the side plate corresponding to the un-bonded side of the display panel includes a double edge folding structure. As shown in FIG. 15, the double edge folding structure includes a first side edge 521 and a second side edge 522 connected to each other, and the second side edge 522 is connected with the base plate 51; and the opening is arranged on a side of the first side edge near the base plate. FIG. 14, the first side edge 521 of the side plate 52 is provided with an opening; and in FIG. 15, the first side edge 521 of the side plate 52 is not provided with an opening.

The side plate may have a double edge folding structure at all parts corresponding to the un-bonded side of the display panel, or a part of the side plate may have the double edge folding structure, which is not limited here. For example, the un-bonded side of the display panel includes a U side corresponding to the bonded side, and an L side and R side that are connected with the U side and the bonded side respectively, then a part of the side plate corresponding to the U side can still be set as a single side edge structure, and a part of the side plate corresponding to the L side and the R side can be set as a double edge folding structure respectively.

The back cover of the display module has good heat dissipation, non-magnetism, and no effect on GPS function, can ensure sufficient hardness, and can fully meet the requirements on heat dissipation, magnetism, and hardness of the small-size glasses-free 3D display devices, for example a glasses-free 3D tablet of 10.87 inch.

Figure 17:
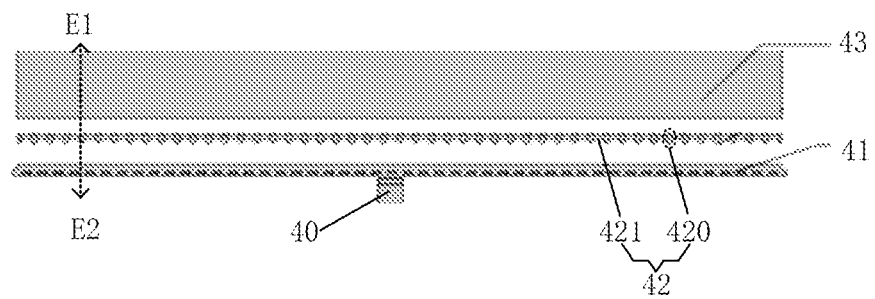
FIG. 17 is a structural schematic diagram of a light guide plate, a light bar and a reflection fixed strip provided by an embodiment of the present application.
Figure 18:
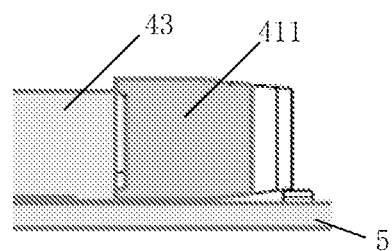
FIG. 18 is a cross sectional view along E1E2 direction shown in FIG. 17.

In one or more embodiments, in combination with FIGS. 17 and 18, the backlight module includes a reflective fixing tape 42, a light guide plate 43 and a light bar 41. The light bar 41 is arranged on a side edge of the light guide plate 43 and includes a plurality of light emitting diodes 411. The reflective fixing tape 42 includes a reflective tape 421 and a plurality of fixing parts 420 fixed on the reflective tape 421. The reflective tape 421 is pasted on the back cover 5. The fixing part 420 is arranged between adjacent light emitting diodes 411, and the plurality of fixing parts are used for fixing the light guide plate to the plurality of light emitting diodes.

The light emitting diodes can be Side View LED, i.e., chip pins are on a side of a light emitting direction. The position of the light bar can correspond to the bonded side of the display panel. The light bar can also include a circuit board provided with a plurality of light emitting diodes, and the circuit board can be attached to the back cover. As shown in FIG. 17, the backlight module may further include an LED drive board 40, which may be used to provide a drive signal for the LED to control whether the LED emits light or not.

The materials of the light guide plate and the reflective tape are not limited, and the fixing parts can be fixing tapes.

To better fix the light guide plate, as shown in FIG. 10, the backlight module may further include a light guide plate tape 430. A side edge of the light guide plate corresponding to the U side of the display panel can be fixed to the back cover through the light guide plate tape. In addition, in order to improve the luminous effect, as shown in FIG. 10, the above backlight module can further include a reflection film 11 located between the back cover 5 and the light guide plate 43, and a first diffusion film 45, a second diffusion film 46 and an anti-reflection film 47 stacked on the light-exiting side of the light guide plate 43 successively.

By arranging the reflective fixing tape, on the one hand, the reflective tape can reflect the light emitted from the LED to the reflective tape, so as to improve the light utilization rate; and on the other hand, the fixing parts can Make the LED and the light guide plate closely connected to maintain zero gap, so as to reduce the light loss and further improve the light utilization rate.

In one or more embodiments, as shown in FIG. 10, the display module further includes an adhesive layer 7 arranged between the backlight module 4 and the display panel 2.

Figure 19:
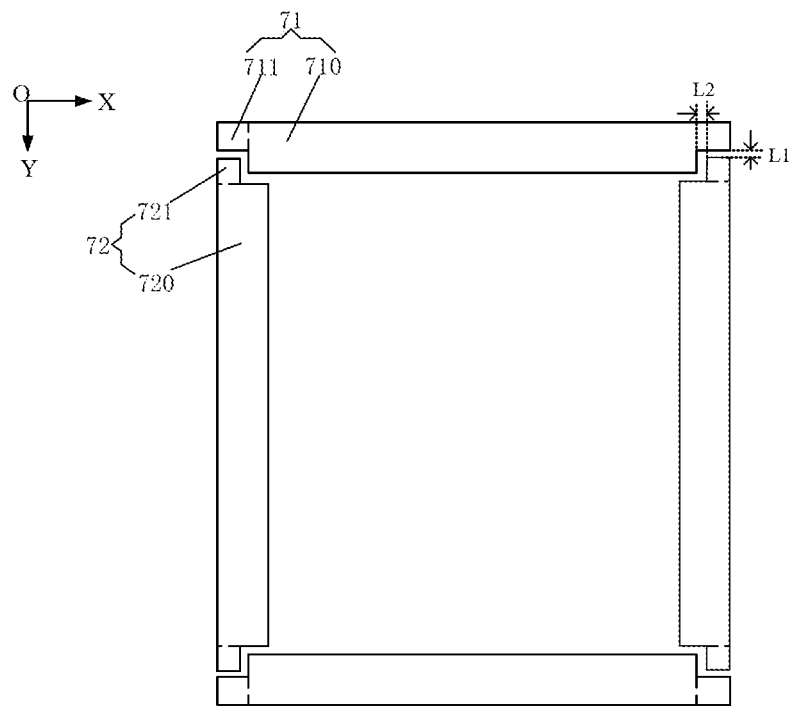
FIG. 19 is a structural schematic diagram of a bonding layer provided by an embodiment of the present application.

As shown in FIG. 19, the adhesive layer 7 includes a first adhesive part 71 extending along a first direction (the OX direction) and a second adhesive part 72 extending along a second direction (the OY direction). The first adhesive part 71 and the second adhesive part 72 are not connected, and the first direction (the OX direction) intersects with the second direction (the OY direction).

Figure 20:
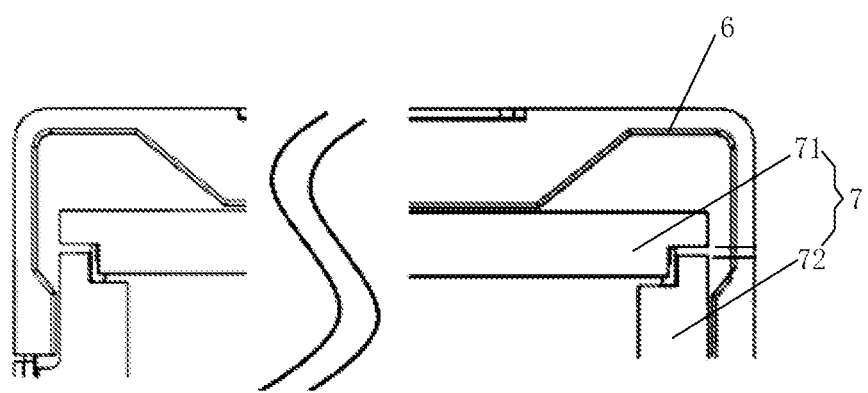
FIG. 20 is a partial structural schematic diagram of a bonding layer and a middle frame provided by an embodiment of the present application.

The adhesive layer can fix the display panel to the backlight module. The shape and distribution of the adhesive layer are not limited here. In order to prevent light leakage from the backlight module to the surrounding of the display panel, the adhesive layer 7 can be an adhesive having a shape of "☐" as shown in FIG. 19 and FIG. 20, and the adhesive is arranged close to the middle frame 6 and includes two parallel first adhesive parts 71 and two parallel second adhesive parts 72, and each of the first adhesive parts and the second adhesive parts include a body and a protrusion part located at both ends of the body respectively. A distance L1 between a protrusion part 711 of the first adhesive part 71 and a protrusion part 721 of the adjacent second adhesive part 72, along the second direction, the OY direction, can range from 0.1 mm to 0.5 mm, for example, 0.3 mm. A distance L2 between a body 710 of the first adhesive part 71 and the protrusion part 721 of the adjacent second adhesive part 72 along the first direction, the OX direction, can range from 0.1 mm to 0.5 mm, for example, 0.3 mm. In FIG. 19, the body of the second adhesive part 72 is labeled as 720.

The adjacent first adhesive part and second adhesive part are not connected, and there is an air gap therebetween. Therefore, in the subsequent formation of a glasses-free 3D display device with a touch function, it is beneficial to fit the touch unit to avoid the white edge phenomenon caused by the bulging of related film layers due to poor exhaust during the fitting of touch unit.

Figure 21:
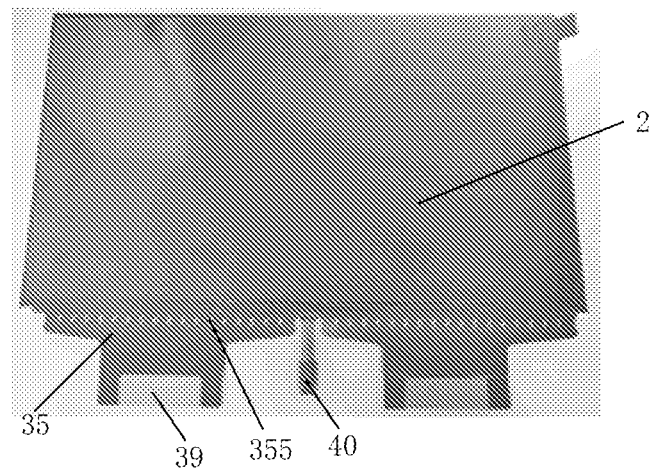
FIG. 21 is a front schematic diagram of a real product photo of a display module provided by an embodiment of the present application.
Figure 22:
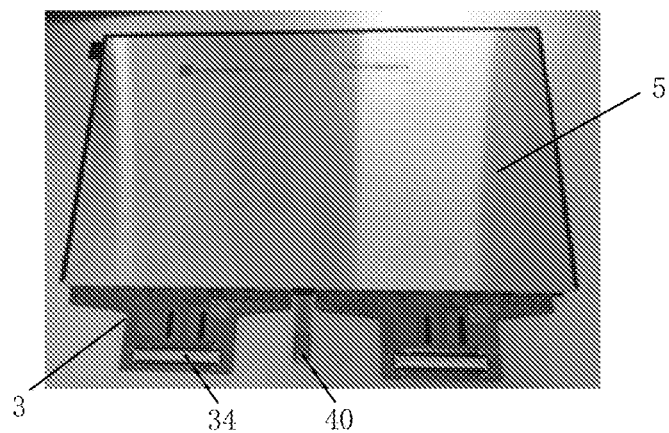
FIG. 22 is a back schematic diagram of a display module shown in FIG. 21.

FIG. 21 and FIG. 22 are real product photos of the liquid crystal display module in a glasses-free 3D tablet of 10.87 inch, where FIG. 21 is a front view and FIG. 22 is a back view. The thickness of the liquid crystal display module is 2.51 mm, the narrowest four-sided frame is 3.12 mm, and the brightness can reach 450 nit. The design cost is greatly reduced while ensuring good picture quality, and high mass production is realized. As shown in FIG. 21 and FIG. 22, the liquid crystal display module includes two special-shaped flexible printed circuit boards 3; the second end of the special-shaped flexible printed circuit boards 3 is provided with the second connection buckle 34; and an LED drive board 40 is arranged between the two special-shaped flexible printed circuit boards 3. In FIG. 21, the non-gold finger side of the special-shaped flexible printed circuit boards is pasted with the first conductive cloth 35 that is adhered to both ends of the reinforced steel plate 39. The first conductive cloth 35 further includes a plurality of racetrack-shaped holes 355 arranged in parallel to facilitate the reduction of bending stress. In FIG. 22, as a skeleton of the entire liquid crystal display module, the back cover 5 is made of GM55 material, has excellent heat dissipation and complete non-magnetism, and can play a good supporting role.

The embodiment of the present application further provides a display device including the display module described above.

The display device can be a glasses-free 3D tablet, a glasses-free 3D mobile phone, a glasses-free 3D computer, a virtual reality (VR) device or an augmented reality (AR) device, and has the advantages of low design cost, good picture quality, high mass production and low maintenance cost.

Optionally, as shown in FIG. 1, the display device further includes a shell and a drive circuit board, the shell being arranged on the backlight side of the display module, and a gap exists between the shell and the display module. The flexible printed circuit board of the display module is bent so that the second end of the flexible printed circuit board is arranged on the backlight side of the display module, the drive circuit board is clamped and electrically connected with the second end, and the drive circuit board is fixed to the shell.

The drive circuit board generally adopts an FPGA circuit board that has large overall weight and the heat generated is extremely high. When the drive circuit board is fixed to the shell, the gap between the shell and the display module can increase the heat dissipation space and improve the heat dissipation efficiency. Meanwhile, the drive circuit board is clamped and electrically connected with the flexible printed circuit board. Accordingly, when the grating of the display module or the drive circuit board is defective and needs to be repaired, maintenance may be performed only by unlocking the buckles, without performing unbonding operation, thus greatly reducing the difficulty and cost of maintenance.

It should be noted that the relevant structural description of the display module involved in the embodiment of the present application can be referred to the above embodiment and will not be repeated here. In addition, the display device can also include other structures. Here, only the content related to the invention point is introduced. The rest of the structures can be obtained by referring to the relevant technology, and will not be described here.

"One embodiment", "embodiments" or "one or more embodiments" herein means that specific features, structures or characteristics described in combination with the embodiments are included in at least one embodiment of the present application. In addition, it should be noted that the examples of words "in one embodiment" here may not all refer to the same embodiment.

Many specific details are described in the description provided here. However, it is understood that the embodiments of the present application can be practiced without these specific details. In some instances, known methods, structures and techniques are not shown in detail, so as not to obscure the understanding of this description.

Finally, it should be noted that the above embodiments are only used for describing the technical solution of the present invention rather than limitation. Although the present application is described in detail by referring to the above embodiments, those ordinary skilled in the art should understand that: the technical solution recorded in each of the above embodiments can be still amended, or some technical features therein can be replaced equivalently. However, these amendments or replacements do not enable the essence of the corresponding technical solutions to depart from the spirit and the scope of the technical solutions of various embodiments of the present application.

The invention claimed is:

1. A display module, applied to a glasses-free 3D display device comprising a drive circuit board, the drive circuit board comprising at least one first connection buckle;
wherein the display module comprises a display panel and
at least one flexible printed circuit board; the flexible printed circuit board comprises a first end and a second end opposite to each other, wherein the first end comprises a plurality of bonding parts, and the display panel comprises a plurality of to-be-bonded parts, each of the bonding parts being bonded to a corresponding one of the to-be-bonded parts; the second end comprises a second connection buckle, and the second connection buckle is clamped and electrically connected with the first connection buckle;

wherein the display module further comprises at least one first conductive cloth, the flexible printed circuit board comprises a gold finger side and a non-gold finger side opposite to each other; wherein the first conductive cloth is at least partially adhered to a surface of the non-gold finger side of the flexible printed circuit board.

2. The display module according to claim 1, wherein a size of the first conductive cloth is less than a size of the flexible printed circuit board.

3. The display module according to claim 1, wherein the first conductive cloth comprises a black conductive coating, a conductive tensile layer and a conductive adhesive layer that are stacked, and the conductive adhesive layer is adhered to the surface of the non-gold finger side.

4. The display module according to claim 1, wherein the first conductive cloth is provided with a plurality of through holes, and positions of the through holes correspond to a bending area of the flexible printed circuit board.

5. The display module according to claim 1, wherein the flexible printed circuit board further comprises a supporting plate, wherein the supporting plate and the second connection buckle are arranged to be opposite to each other, the supporting plate being arranged at the non-gold finger side, the second connection buckle being arranged at the gold finger side;

wherein the first conductive cloth is at least partially adhered to the supporting plate and adhered to all areas on the non-gold finger side except for an area where the supporting plate is located.

6. The display module according to claim 5, wherein the flexible printed circuit board further comprises an anti-electromagnetic layer arranged all areas on the non-gold finger side except for the area where the supporting plate is located, the first conductive cloth is also adhered to the entire anti-electromagnetic layer.

7. The display module according to claim 5, wherein the flexible printed circuit board further comprises a plurality of copper leakage areas, and the first conductive cloth is grounded through the copper leakage areas.

8. The display module according to claim 1, further comprising at least one second conductive cloth arranged at an un-bonded side edge of the display panel.

9. The display module according to claim 8, wherein the first conductive cloth and any of the second conductive cloth are arranged separately.

10. The display module according to claim 9, wherein the first conductive cloth and the second conductive cloth adjacent to each other are overlapped at a junction, and two adjacent second conductive cloths are overlapped at a junction.

11. The display module according to claim 1, further comprising a middle frame, a backlight module and a back cover, wherein the backlight module is arranged at a backlight side of the display panel;

wherein the middle frame is fixed to the back cover and configured to support the display panel; the back cover is configured to support the middle frame and the backlight module; and the backlight module is arranged between the back cover and the display panel.

12. The display module according to claim 11, wherein the middle frame comprises a plurality of fastening buckles, and the middle frame is clamped with the back cover through the fastening buckles.

13. The display module according to claim 12, wherein the back cover comprises a base plate and a side plate, and the side plate is arranged around the base plate and connected with the base plate;

wherein the side plate is provided with a plurality of openings on a side close to the base plate, and the fastening buckles are embedded in the openings.

14. The display module according to claim 13, wherein a material of the back cover comprises GM55.

15. The display module according to claim 14, wherein a part of the side plate corresponding to an un-bonded side of the display panel comprises a double edge folding structure;

wherein the double edge folding structure comprises a first side edge and a second side edge connected to each other, the second side edge being connected with the base plate, and the openings are arranged on a side of the first side edge close to the base plate.

16. The display module according to claim 11, wherein the backlight module comprises a reflective fixing tape, a light guide plate and a light bar;

wherein the light bar is arranged on a side edge of the light guide plate, and comprises a plurality of light emitting diodes; the reflective fixing tape comprises a reflective tape and a plurality of fixing parts fixed on the reflective tape, the reflective tape is pasted on the back cover; the fixing parts are arranged between adjacent light emitting diodes; and the plurality of fixing parts are used for fixing the light guide plate to the plurality of light emitting diodes.

17. The display module according to claim 11, further comprising an adhesive layer arranged between the backlight module and the display panel;

wherein the adhesive layer comprises a first adhesive part extending along a first direction and a second adhesive part extending along a second direction, the first adhesive part and the second adhesive part are not connected, the first direction intersects with the second direction.

18. A display device, comprising a drive circuit board and a display module, wherein the drive circuit board comprises at least one first connection buckle;

wherein the display module comprises a display panel and at least one flexible printed circuit board; the flexible printed circuit board comprises a first end and a second end opposite to each other, wherein the first end comprises a plurality of bonding parts, and the display panel comprises a plurality of to-be-bonded parts, each of the bonding parts being bonded to a corresponding one of the to-be-bonded parts; the second end comprises a second connection buckle, and the second connection buckle is clamped and electrically connected with the first connection buckle;

wherein the display module further comprises at least one first conductive cloth, the flexible printed circuit board comprises a gold finger side and a non-gold finger side opposite to each other; wherein the first conductive cloth is at least partially adhered to a surface of the non-gold finger side of the flexible printed circuit board.

19. The display device according to claim 18, further comprising a shell;

wherein the shell is arranged on a backlight side of the display module, and a gap exists between the shell and the display module; the flexible printed circuit board of the display module is bent so that the second end of the flexible printed circuit board is arranged on the backlight side of the display module, the drive circuit board is clamped and electrically connected with the second end, and the drive circuit board is fixed to the shell.

* * * * *